US011206742B2

(12) United States Patent
Morita et al.

(10) Patent No.: US 11,206,742 B2
(45) Date of Patent: Dec. 21, 2021

(54) DEVICE CASING

(71) Applicant: Clarion Co., Ltd., Saitama (JP)

(72) Inventors: Shinji Morita, Saitama (JP); Sachiko Toshimori, Saitama (JP)

(73) Assignee: CLARION CO., LTD., Saitama (JP)

( * ) Notice: Subject to any disclaimer, the term of this patent is extended or adjusted under 35 U.S.C. 154(b) by 0 days.

(21) Appl. No.: 17/049,809

(22) PCT Filed: Jan. 29, 2019

(86) PCT No.: PCT/JP2019/002836
§ 371 (c)(1),
(2) Date: Oct. 22, 2020

(87) PCT Pub. No.: WO2019/207873
PCT Pub. Date: Oct. 31, 2019

(65) Prior Publication Data
US 2021/0243909 A1 Aug. 5, 2021

(30) Foreign Application Priority Data

Apr. 25, 2018 (JP) .............................. JP2018-083711

(51) Int. Cl.
*G06F 1/16* (2006.01)
*H05K 5/00* (2006.01)
(Continued)

(52) U.S. Cl.
CPC ............. *H05K 5/03* (2013.01); *H05K 7/1405* (2013.01); *H05K 7/18* (2013.01)

(58) Field of Classification Search
CPC .......... H05K 5/03; H05K 5/02; H05K 7/1405; H05K 7/1402; H05K 7/1401; H05K 7/14; H05K 7/18
See application file for complete search history.

(56) References Cited

U.S. PATENT DOCUMENTS 6,942,153 B1 * 9/2005 Yuan ..................... G06F 1/1626
235/380
8,170,407 B2 5/2012 Kurokawa
(Continued)

FOREIGN PATENT DOCUMENTS

CN 102316185 A 1/2012
JP H08-130382 A 5/1996
(Continued)

OTHER PUBLICATIONS

International Search Report with English translation and Written Opinion issued in corresponding application No. PCT/JP2019/002836 dated Apr. 23, 2019.
(Continued)

*Primary Examiner* — Anthony M Haughton
(74) *Attorney, Agent, or Firm* — Foley & Lardner LLP

(57) ABSTRACT

A device casing is configured to include a first casing member provided with a hole including a guide hole and a fitting hole that communicates with the guide hole, and a second casing member provided with a protrusion at a position corresponding to the hole, the second casing member being configured to be fixed with respect to the first casing member by fitting the protrusion to the fitting hole. The guide hole guides movement of the protrusion that entered within the guide hole in an oblique direction when fixing the second casing member with respect to the first casing member so that the second casing member can get close to the first casing member in a state where the second casing member is guided in the oblique direction. The protrusion that moved in the oblique direction along the guide hole, passed through the guide hole and reached inside the fitting hole fits to the fitting hole. The second casing member is fixed with respect to the first casing member by the fitting of the protrusion to the fitting hole.

6 Claims, 6 Drawing Sheets

(51) Int. Cl.
*H05K 7/00* (2006.01)
*H05K 5/03* (2006.01)
*H05K 7/14* (2006.01)
*H05K 7/18* (2006.01)

(56) References Cited

U.S. PATENT DOCUMENTS

| | | | |
|---|---|---|---|
| 9,042,095 B2* | 5/2015 | Song | B32B 38/0012 |
| | | | 361/679.56 |
| 9,101,066 B2 | 8/2015 | Azumi | |
| 9,462,098 B2* | 10/2016 | Chang | H04M 1/18 |
| 9,699,943 B2* | 7/2017 | Bae | H01L 51/0096 |
| 9,894,191 B2* | 2/2018 | Kim | H04M 1/026 |
| 10,521,040 B2* | 12/2019 | Lin | G06F 3/0412 |
| 10,627,858 B2* | 4/2020 | Seo | H05K 5/04 |
| 10,678,310 B2* | 6/2020 | Hamann | H02J 7/342 |
| 10,860,061 B2* | 12/2020 | Park | G06F 1/1626 |
| 10,877,519 B2* | 12/2020 | Lin | G06F 1/1656 |
| 2008/0081679 A1* | 4/2008 | Kawasaki | H04B 1/3888 |
| | | | 455/575.8 |
| 2011/0097070 A1 | 4/2011 | Kurokawa | |
| 2013/0027862 A1* | 1/2013 | Rayner | H01H 13/06 |
| | | | 361/679.3 |
| 2014/0076772 A1 | 3/2014 | Azumi | |

FOREIGN PATENT DOCUMENTS

| | | |
|---|---|---|
| JP | 2006-106632 A | 4/2006 |
| JP | 2011-097414 A | 5/2011 |
| JP | 2014-60307 A | 4/2014 |

OTHER PUBLICATIONS

Office Action dated Apr. 29, 2021 in Chinese Application No. 201990000668.2.
International Preliminary Report on Patentability and Written Opinion of the International Searching Authority issued in corresponding application No. PCT/JP2019/002836 dated Nov. 5, 2020 with English translation.

* cited by examiner

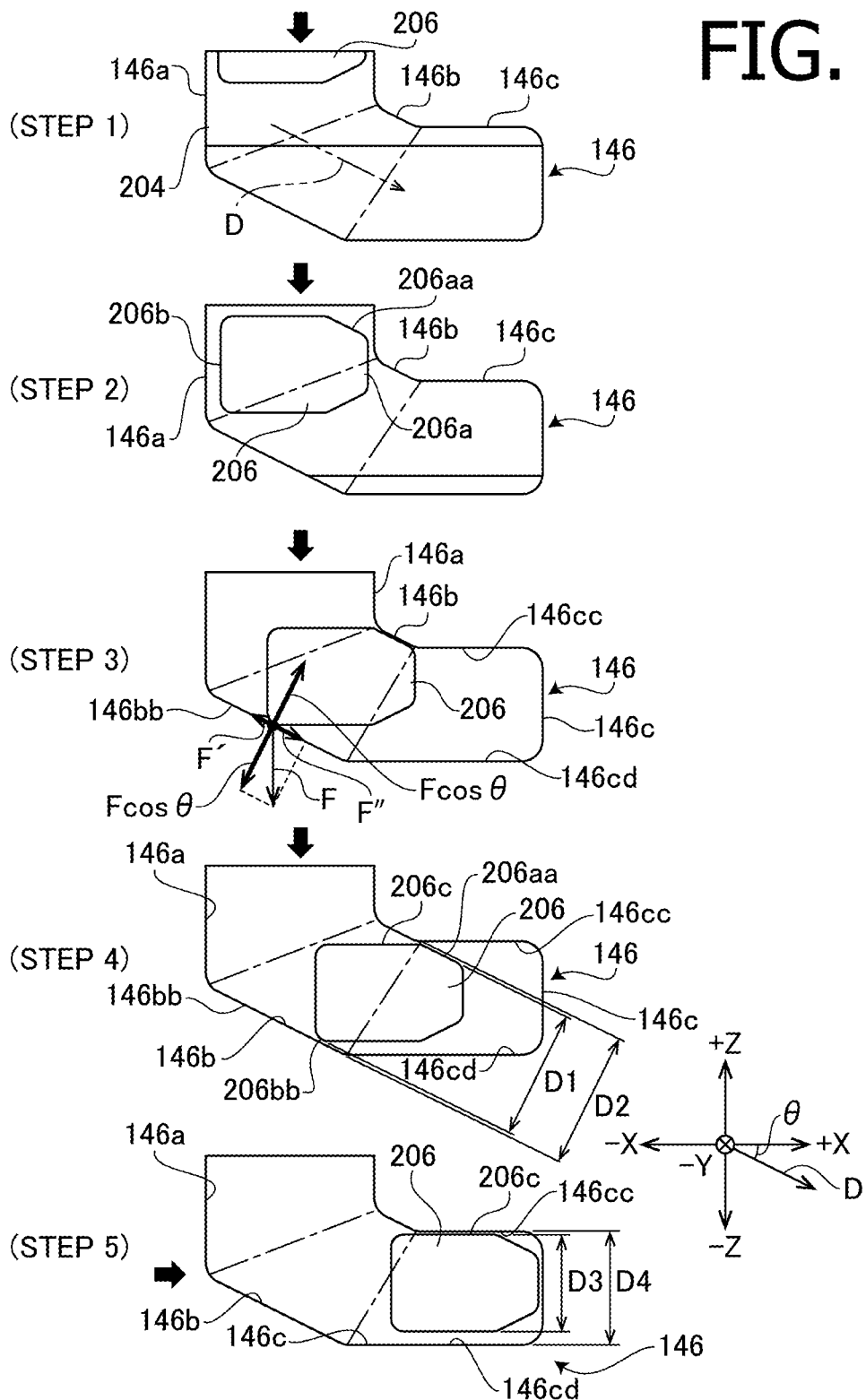

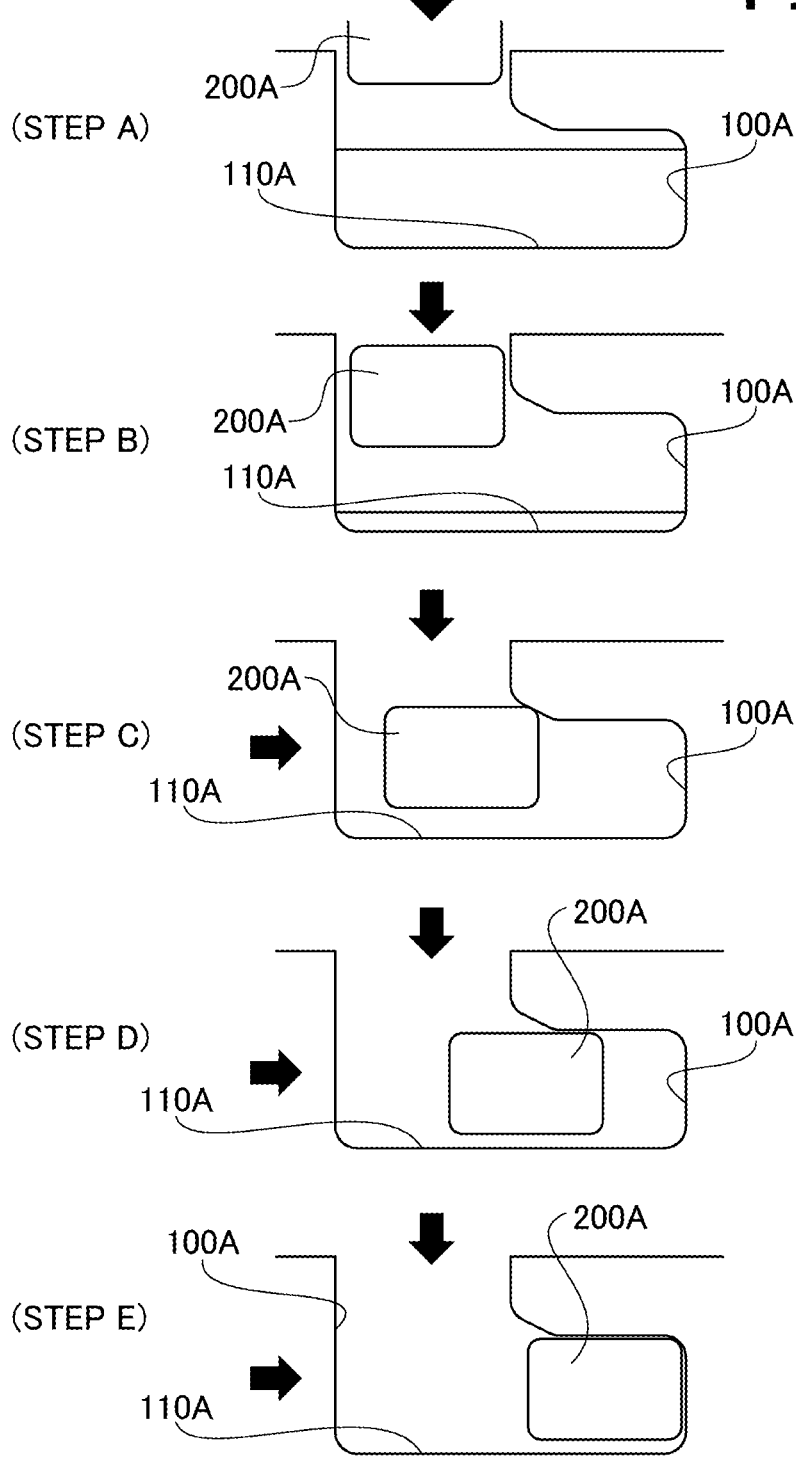

DEVICE CASING

TECHNICAL FIELD

The present invention relates to device casing.

BACKGROUND ART

There has been known a device casing for accommodating built-in components such as electronic parts. For example, Japanese Patent Application Publication No. 2014-60307 (hereinafter referred to as "Patent Document 1") discloses a casing configured to accommodate built-in components within a space defined by a casing main body and a cover member by fixing the cover member to the casing main body with screws to cover an opening of the casing main body.

In the casing disclosed in Patent Document 1, a plurality of screw holes for inserting fastening screws are formed to each of the cover member and the casing main body in order to fasten the cover member to the casing main body. These screw holes are formed around the space for accommodating the built-in components.

SUMMARY OF THE INVENTION

By adopting a configuration which makes it possible to fix the cover member to the casing main body without fastening screws, it becomes unnecessary to form the screw holes around the space for accommodating the built-in components and thus it becomes possible to decrease external dimensions of the casing. A specific example of a casing having such configuration is shown in FIG. 5A with a perspective view.

A casing 2A illustrated in FIG. 5A includes a casing main body 10A having a substantially flattened rectangular shape with an opening on its upper surface, and a cover member 20A opposing with the upper surface of the casing main body 10A and having a substantially flattened rectangular shape with an opening on its lower surface. To the casing main body 10A, a pair of outer walls 11A, 12A being parallel to each other are formed. To each of the outer walls 11A, 12A, a plurality of L-shaped grooves 100A are formed with intervals therebetween. To the cover member 20A, a pair of opposing inner walls 21A, 22A are formed. To each of the inner walls 21A, 22A, protrusions 200A are formed at positions corresponding to the respective grooves 100A.

An entire inner peripheral surface of the cover member 20A is formed to be larger than an entire outer peripheral surface of the casing main body 10A to a small extent. Therefore, as the casing main body 10A and the cove member 20A are assembled (as the cover member 20A is fitted to the casing main body 10A), the entire inner peripheral surface of the cover member 20A surrounds the entire outer peripheral surface of the casing main body 10A substantially without gap, and the built-in components is accommodated within a space defined by the casing main body 10A and the cover member 20A.

When fitting the cover member 20A to the casing main body 10A, an operator makes the protrusions 200A fit to respective grooves 100A. The cover member 20A is thereby fixed to the casing main body 10A. FIG. 5B shows movements of the protrusion 200A with respect to the groove 100A until the protrusion 200A fits to the corresponding groove 100A in five separate steps. In FIG. 5B, arrows indicate directions in which the operator applies load when assembling the cover member 20A to the casing main body 10A.

The operator positions the cover member 20A with respect to the casing main body 10A such that the protrusions 200A enter the respective grooves 100A from starting ends of the respective grooves 100A formed to respective outer wall surfaces 11A, 12A of the casing main body 10A, and pushes the positioned cover member 20A downward (toward the casing main body 10A) until each protrusion 200A abuts a lower end 110A of the corresponding groove 100A (Steps A to B of FIG. 5B).

After pushing the cover member 20A until the protrusions 200A abut respective lower ends 100A, the operator makes the cover member 20A to slide laterally with respect to the casing main body 10A. The protrusions 200A thereby slide laterally within the grooves 100A and fit to the grooves 100A at positions at the end of the sliding (Steps C to E of FIG. 5B). The cover member 20A is fixed with respect to the casing main body 10A by the fitting of the protrusions 200A to respective grooves 110A.

The casing main body 10A and the cover member 20A are resin molded components. Therefore, the casing main body 10A and the cover member 20A have deformations such as warpage, bentness and distortion with respect to an ideal shape (designed shape) to no small degree due to influences of factors such as residual stress and volume contraction that occurs during cooling (curing). Therefore, there is a case where, for example, one pair of the groove 100A and protrusion 200A among a plurality of pairs of the grooves 100A and protrusions 200A are fitted but, in the remaining pairs, the protrusions 200A are floating with respect to the grooves 100A by amounts corresponding to the deformation and thus are not fitted to the grooves 100A.

In order to make all the pairs of the grooves 100A and protrusions 200A fit, the operator has to make the cover member 20A to slide laterally with respect to the casing main body 10A while correcting the deformation of the cover member 20A to fit to the shape of the casing main body 10A (in other words, while making the cover member 20A to deform such that the protrusion 200A does not float with respect to the groove 100A in every pair) by pressing the entire cover member 20A from above (by applying load toward the casing main body 10A) with one or more hands (or by using a jig) (See the arrows shown in steps C and D of FIG. 5B). That is, the operator is forced to make the cover member 20A slide laterally while pressing the entire cover member 20A toward the casing main body 10A which is a difficult operation.

The present invention is made in view of the foregoing circumstance, and the object of the present invention is to improve ease of assembly of a casing having a configuration in which a second casing member (e.g., a cover member) is fixed with respect to a first casing member (e.g., a casing main body).

A device casing according to an embodiment of the present invention includes a first casing member provided with a hole including a guide hole and a fitting hole that communicates with the guide hole, and a second casing member provided with a protrusion at a position corresponding to the hole, the second casing member being configured to be fixed with respect to the first casing member by fitting the protrusion to the fitting hole. The guide hole guides movement of the protrusion that entered within the guide hole in an oblique direction when fixing the second casing member with respect to the first casing member so that the second casing member can get close to the first casing member in a state where the second casing member is guided in the oblique direction. The protrusion that moved in the oblique direction along the guide hole, passed through the guide hole and reached inside the fitting hole fits to the fitting hole. The second casing member is fixed with respect to the first casing member by the fitting of the protrusion to the fitting hole.

The guide hole may have a hole shape that extends in the oblique direction and may be configured to guide the protrusion that entered within the guide hole from a starting end of the guide hole in the oblique direction. In this case, the fitting hole has a hole shape that extends in a direction different from the oblique direction, and the protrusion that passed through a terminal of the guide hole and reached inside the fitting hole fits to the fitting hole.

The oblique direction is, for example, a direction at an angle to a first direction. In this case, a plurality of the holes may be provided to the first casing member, and the plurality of holes may be disposed to be arranged with intervals therebetween in the first direction. A plurality of the protrusions may be provided to the second casing member, and the plurality of protrusions may be disposed at positions corresponding to the respective plurality of holes. In this case, the second casing member is fixed with respect to the first casing member by the protrusions fitting to the fitting holes of the respective holes.

The first casing member may be configured to have a casing main body and an installed member installed within the casing main body. In this case, the hole is formed to the installed member.

The casing main body may be a substantially flattened rectangular member with an opening on an upper surface thereof. In this case, the installed member is a frame-like member formed along inner wall surfaces of the casing main body, the plurality of holes being provided at portions along the inner wall surfaces of the casing main body extending in the first direction such that the plurality of holes are arranged with intervals therebetween. The second casing member is a substantially flattened rectangular cover member with an opening on a lower surface facing the upper surface of the casing main body, the plurality of protrusions being provided at positions, on inner wall surfaces of the second casing member extending in the first direction, corresponding to the respective plurality of holes, the second casing member covering the opening on the upper surface of the casing main body when the protrusions are fitted to the fitting holes of the respective holes and the second casing member is fixed with respect to the first casing member.

The first casing member and the second casing member may be configured to have a fitted part and a fitting part, respectively. When the protrusion fits to the fitting hole, the fitting part fits to the fitted part and reinforces the fixed state of the first casing member and the second casing member by the fitting of the protrusion and the fitting hole.

According to an embodiment of the present invention, ease of assembly of a casing having a configuration in which a second casing member is fixed with respect to a first casing member is improved.

BRIEF DESCRIPTION OF THE DRAWINGS

FIG. 4 is a diagram showing movements of a protrusion with respect to a hole until the protrusion provided to the device according to the embodiment of the present invention fits to a corresponding hole in five separate steps.

FIG. 5B is a diagram showing movements of a protrusion with respect to a groove until the protrusion provided to the device shown in FIG. 5A having conventional configuration fits to the corresponding groove in five separate steps.

EMBODIMENTS FOR CARRYING OUT THE INVENTION

Hereinafter, a device according to an embodiment of the present invention will be described with reference to the drawings. The device according to the present embodiment is a device including a casing configured to accommodate built-in components such as electronic parts and is, for example, an in-vehicle display device, an in-vehicle car navigation device, a tablet terminal device, a PHS (Personal Handy phone System), a smartphone, a feature phone, a portable game or the like.

Figure 1:
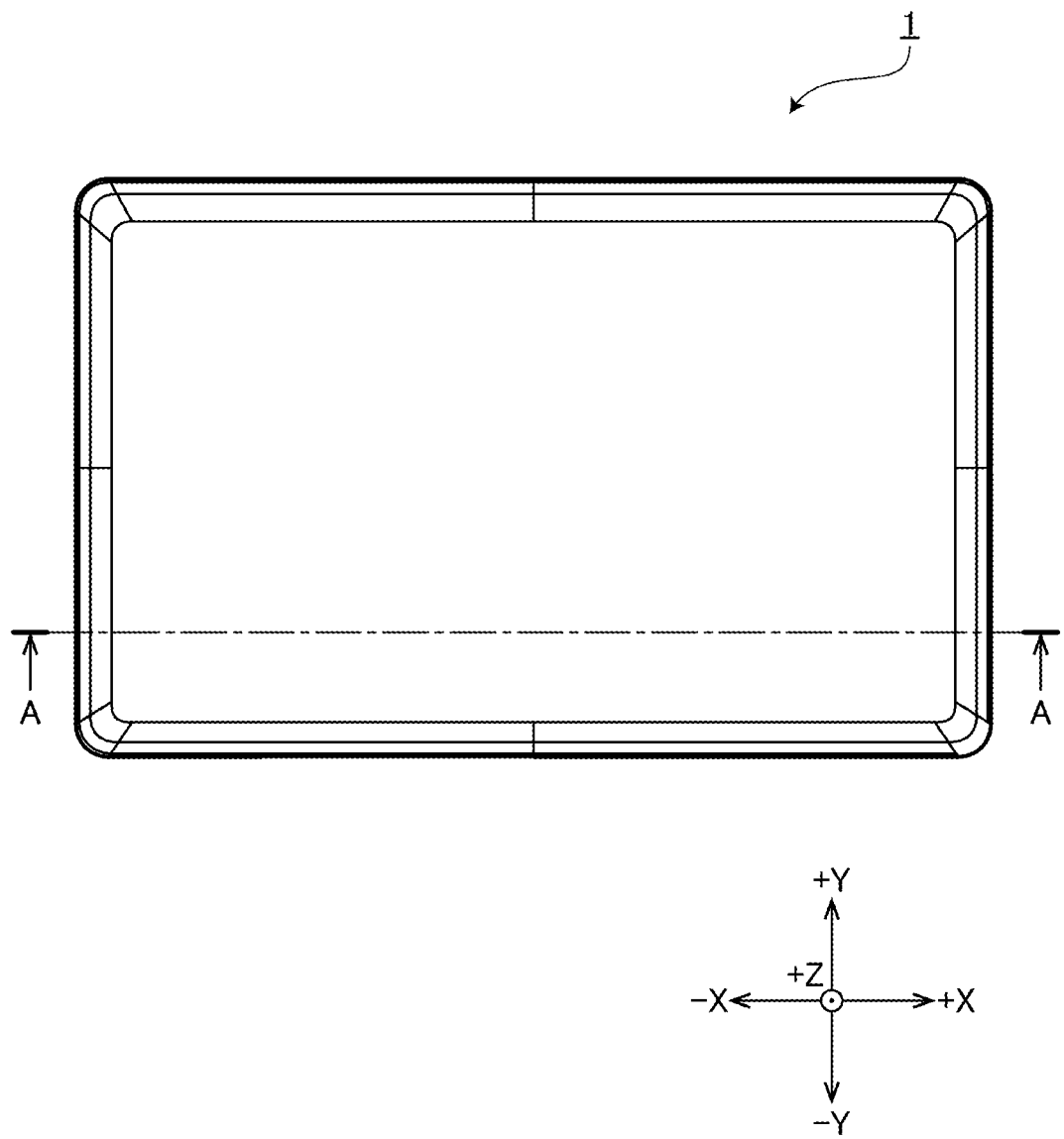
FIG. 1 is an overall view (a top view) of a device according to an embodiment of the present invention.
Figure 2:
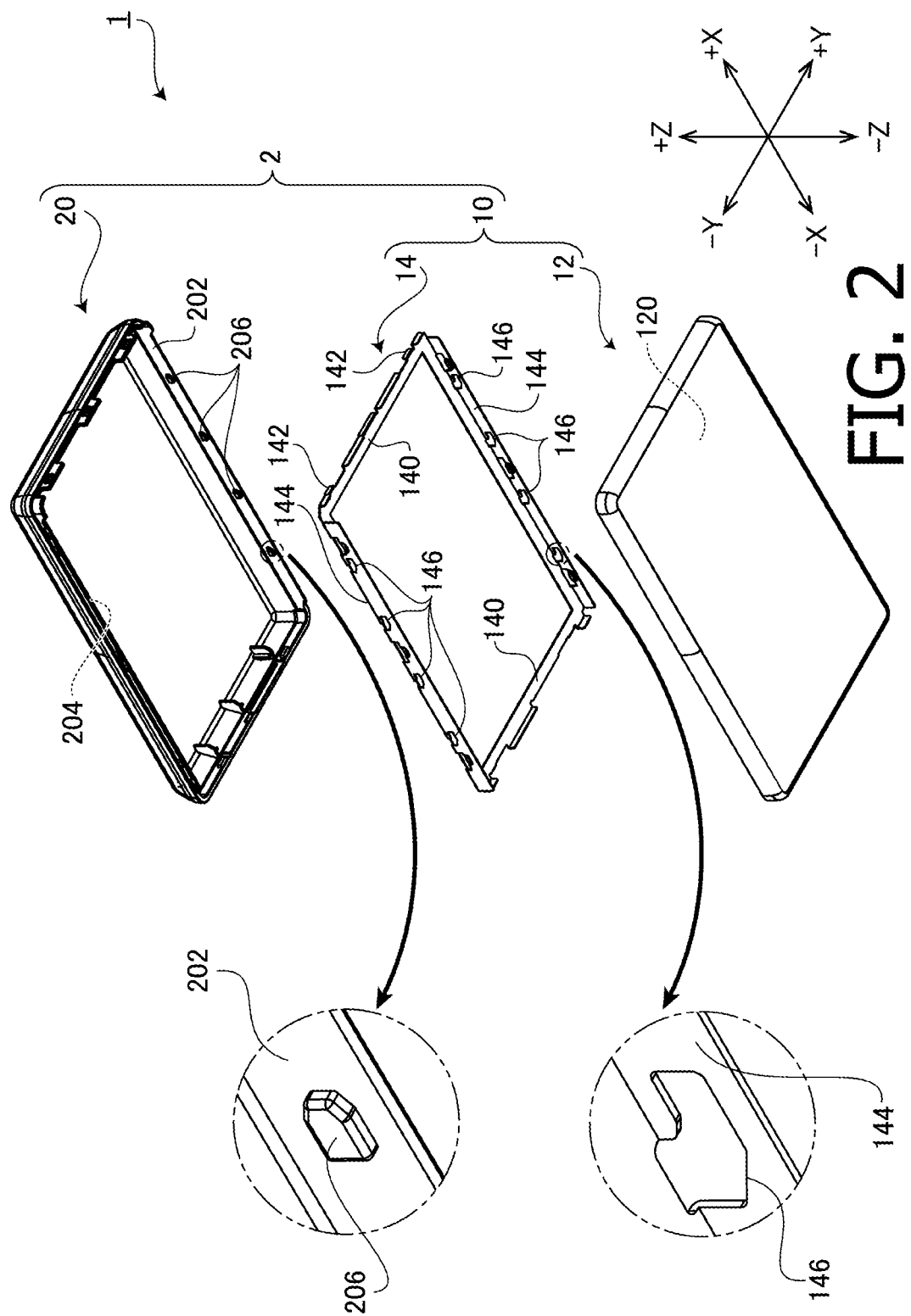
FIG. 2 is an exploded perspective view of the device according to the embodiment of the present invention.
Figure 3:
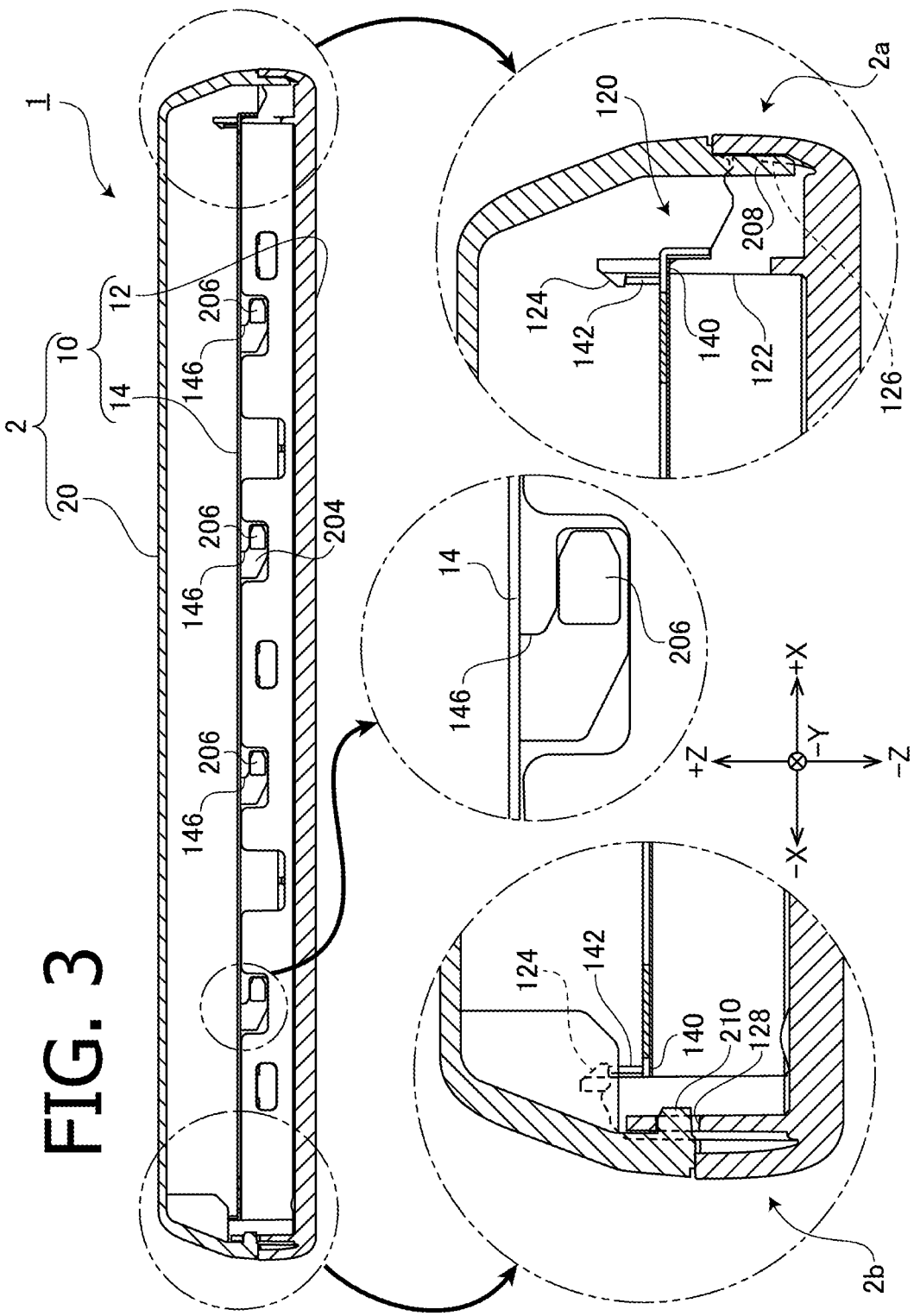
FIG. 3 is an A-A line cross-sectional view showing a cross section of the device according to the embodiment of the present invention cut along a line A-A shown in FIG. 1.

FIG. 1 shows an overall view (a top view) of a device 1 according to an embodiment of the present invention. FIG. 2 shows an exploded perspective view of the device 1. FIG. 3 is an A-A line cross-sectional view showing a cross section of the device 1 cut along a line A-A shown in FIG. 1. In FIG. 1, a direction perpendicular to the sheet is indicated as a Z direction, and two directions perpendicular to the Z direction and perpendicular to each other are indicated as an X direction and a Y direction, respectively. A direction indicated by an arrowhead of the Z direction shown in FIG. 1 is indicated as a +Z direction, and a direction opposite to the +Z direction is indicated as a −Z direction. The rightward direction and the leftward direction in FIG. 1 are indicated as a −X direction and a −X direction, respectively, and the upward direction and a downward direction in FIG. 1 are indicated as a +Y direction and a −Y direction, respectively. The X, Y and Z directions are also indicated in drawings on and after FIG. 2 as necessary.

As shown in FIG. 2, the device 1 includes a casing 2. In each drawing including FIG. 2 (in drawings showing an inside of the casing 2), for the sake of convenience, illustration of built-in components such as electronic parts are omitted and only the casing 2 is shown.

The casing 2 includes a casing member 10 being and example of a first casing member, and a cover member 20 being an example of a second casing member. The casing member 10 includes a casing main body 12 and a frame-like member (installed member) 14.

The casing main body 12 is a resin molded component and is a substantially flattened rectangular member with an opening on its upper surface (See FIG. 3.). For the sake of convenience, a reference numeral 120 is assigned to the opening on the upper surface of the casing main body 12. The frame-like member 14 is a metallic part and has a rectangular frame-shape extending along the entire circumference of an inner wall surface of the casing main body 12 being a rectangular member.

As shown in FIG. 3, supporting parts 122 and hook parts 124 are formed to the casing main body 12. In FIG. 3, the supporting part 122 is shown only at an end portion 2a of the casing 2, but the supporting part 122 is also formed not only at the end portion 2*a* by also at an end portion 2*b* of the casing 2 (at a position that cannot be seen in the drawing). In FIG. 3, one hook part 124 is shown to each of the end portions 2*a*, 2*b* of the casing 2, but a plurality of hook parts 124 are formed to each of the end portions 2*a*, 2*b* with intervals in the Y direction.

A pair of the supporting parts 122 formed to each of end portions 2*a*, 2*b* of the casing 2 are in surface contact with respective supported areas 140 (See FIG. 2.) of the frame-like member 14 and thereby support the entire frame-like member 14 from below.

To the frame-like member 14, supported sections 142 are formed at positions corresponding to the respective hook parts 124 of the casing main body 12. The hook parts 124 press the entire frame-like member 14 from above by being hooked to upper edges of the respective supported sections 142.

The frame-like member 14 is fixed with respect to the casing main body 12 by being supported by the supporting parts 122 from below and being pressed by the hook parts 124 from above (in other words, by being nipped within the casing main body 12).

As shown in FIG. 2, to the frame-like member 14, a plurality of holes 146 are formed to be arranged with intervals therebetween at portions (a pair of side portions 144) along the inner wall surfaces of the casing main body 12 extending in the X direction (an example of a first direction). For example, four holes 146 are formed to each side portion 144).

The cover member 20 is a resin molded component and is a substantially flattened rectangular member with an opening on its lower surface facing the upper surface of the casing main body 12. The cover member 20 has a pair of inner wall surfaces 202, 204 parallel to each other and extending in the X direction. To each of the inner wall surfaces 202, 204, protrusions 206 are formed at positions corresponding to respective plurality of holes 146 formed to the frame-like member 14. In the present embodiment, four protrusions 206 corresponding to respective holes 146 are formed on each of the inner wall surfaces 202, 204.

As shown in FIG. 3, as the protrusions 206 fit to the respective holes 146, the cover member 20 is fixed with respect to the casing main body 12, and thereby the opening 120 on the upper surface of the casing main body 12 is covered. The not shown built-in components are thereby accommodated within a space defined by the casing main body 12 and the cover member 20.

FIG. 4 shows movements of the protrusion 206 with respect to the hole 146 until the protrusion 206 fits to the corresponding hole 146 in five separate steps. In FIG. 4, arrows indicate directions in which an operator applies load to the over member 20 when assembling the cover member 20 to the casing main body 12.

As shown in FIG. 4, the hole 146 consists of a first guide hole 146*a*, a second guide hole 146*b* (an example of a guide hole) that communicates with the first guide hole 146*a*, and a fitting hole 146*c* that communicates with the second guide hole 146*b*. That is, the hole 146 is a single hole configured from the first guide hole 146*a*, the second guide hole 146*b* and the fitting hole 146*c*. In FIG. 4, for convenience of distinguishably showing the first guide hole 146*a*, the second guide hole 146*b* and the fitting hole 146*c*, dashed-dotted lines are drawn at boundaries between the holes.

The operator positions the cover member 20 with respect to the casing main body 12 such that the protrusions 206 enter into the respective first guide holes 146*a* formed to each of the side portions 144 of the frame-like member 14 from starting ends of the respective first guide holes 146*a* (Step 1 of FIG. 4).

The operator pushes the cover member 20 positioned with respect to the casing main body 12 downward (The operator applies load in the −Z direction toward the casing main body 12.). As the cover member 20 is pushed downward, each protrusion 206 formed to the cover member 20 passes through a terminal of the corresponding first guide hole 146*a* and enters into the second guide hole 146*b* from a starting end of the second guide hole 146*b* (Steps 2 to 3 of FIG. 4).

As shown in FIG. 4, the second guide hole 146*b* has a hole shape that extends in an oblique direction D (See the dashed-two dotted line shown in Step 1 of FIG. 4.) at an angle θ to the +X direction within an XZ plane. The second guide hole 146*b* guides movement of the protrusion 206 entered into the second guide hole 146*b* in the oblique direction D. Since the movement of the protrusion 206 is guided in the oblique direction D, as the cover member 20 is pressed downward by the operator, the cover member 20 gets close to the casing main body 12 while sliding in the oblique direction D with respect to the casing main body 12 (in other words, the cover member 20 moves in the −Z direction and, at the same time, in the +X direction) (Steps 3 to 4 of FIG. 4).

In order to make the cover member 20 slide with respect to the casing main body 12 in the oblique direction D only by the load in the −Z direction applied by the operator (in other words, in order to make the protrusion 206 slide along the second guide hole 146*b* only by the load in the −Z direction applied by the operator), the casing 2 needs to be designed such that a friction force occurring between the protrusion 206 and (an edge 146*bb* of) the second guide hole 146*b* falls below an appropriate value.

Specifically, as a load (e.g., load set by a manufacturer of the device 1 as a standard value) in the −Z direction is applied to the cover member 20 by the operator, a load (a reference numeral F is assigned to this load for the sake of convenience) acts from the protrusion 206 to the edge 146*bb* of the second guide hole 146*b*, and a normal force (=F cos θ) from the edge 146*bb* acts on the protrusion 206 (See Step 3 of FIG. 4.). Assuming that a friction coefficient between the protrusion 206 and the edge 146*bb* is μ, a friction force F' (=F sin θ) μF cos θ) acts between the protrusion 206 and the edge 146*bb*. When the load in the −Z direction is applied to the cover member 20 by the operator, a force component F" (=F sin θ) parallel to the edge 146*bb* acts on the protrusion 206. It becomes possible to make the cover member 20 slide with respect to the casing main body 12 in the oblique direction D only by the load in the −Z direction by the operator by setting the friction coefficient μ (in other words, materials of the protrusion 206 and the second guide hole 146*b*) and an orientation (the angle θ) of the second guide hole 146*b* such that the friction force F' becomes smaller than the force component F".

The protrusion 206 has a shape in which a front edge 206*a* is chamfered larger than a tail edge 206*b* (a slightly tapered shape) so that the protrusion 206 can smoothly move within the second guide hole 146*b*. A surface 206*aa* of the front edge 206*a* is a surface that is obtained by chamfering the front edge 206*a* such that the surface 206*aa* becomes parallel to an extending direction of the second guide hole 146*b* (i.e., the oblique direction D) when sliding within the second guide hole 146*b*.

For the sake of convenience of explanation, a reference numeral D1 is assigned to a distance between an apex 206*bb* of a roundly chamfered part of the tail edge 206*b* and the surface 206*aa*, and a reference numeral D2 is assigned to a width of the second guide hole 146*b* (See Step 4 of FIG. 4.). In order to suppress backlash of the protrusion 206 in directions other than the oblique direction D when the protrusion 206 slides within the second guide hole 146*b*, it is preferable that a difference between the distance D1 and the width D2 is as small as possible. On the other hand, if the difference between the distance D1 and the width D2 is too small, it becomes harder for the protrusion 206 to smoothly slide within the second guide hole 146*b*. By taking into account these points and tolerances, the width D2 is set to a value that is greater than the distance D1 to a small extent.

As the cover member 20 is pushed downward by the operator and the protrusion 206 moves in the +X direction, an upper edge 206*c* of the protrusion 206 hangs to an edge 146*cc* of the fitting hole 146*c* and the protrusion 206 is thereby brought to a state where it is pressed by the edge 146*cc* from above (Step 4 of FIG. 4). All the protrusions 206 formed to the cover member 20 are pressed by the edges 146*cc* of the respective fitting holes 146*c* from above. In other words, the entire cover member 20 is pressed by the edges 146*cc* from above.

Figure 5A:
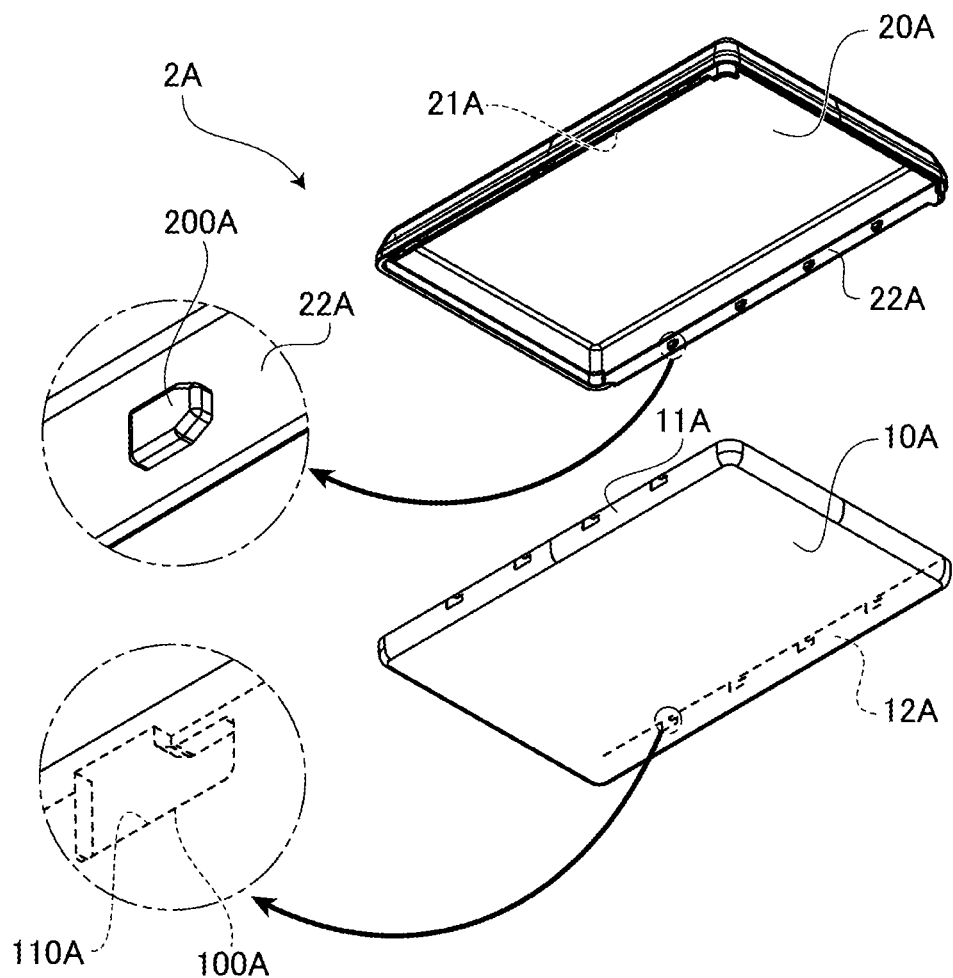
FIG. 5A is a perspective view of a device having conventional configuration.

As with the casing 2A of the conventional configuration shown in FIG. 5A, the casing main body 12 and the cover member 20 have deformations such as warpage, bentness and distortion with respect to an ideal shape (designed shape) to no small degree due to influences of factors such as residual stress and volume contraction that occurs during curing or resin. However, as described above, in the present embodiment, the entire cover member 20 is pressed by the edges 146*cc* from above. Therefore, floating of the protrusions 206 with respect to the holes 146 caused by the deformations of the casing main body 12 and the cover member 20 is prevented.

Therefore, the operator can make the protrusions 206 enter into the fitting holes 146*c* only by moving the cover member 20 with respect to the casing main body 12 in the direction without pressing the cover member 20 (only by applying a load in the +X direction to the casing main body 12).

The fitting hole 146*c* has a hole shape that extends in the X direction. A width D4 of the fitting hole 146*c* is larger than a width D3 of the protrusion 206 to a very small extent when tolerances are considered, but the width D3 and the width D4 are set to substantially the same value. Therefore, as the entire protrusion 206 passes through the terminal of the second guide hole 146*b* and reaches the inside of the fitting hole 146*c*, the protrusion 206 fits to the fitting hole 146*c* (See Step 5 of FIG. 4 and FIG. 3.). The cover member 20 becomes fixed with respect to the casing main body 12 as all the protrusions 206 formed to the cover member 20 fit to the respective fitting holes 146*c*.

As an additional remark, the protrusion 206 fits to the fitting hole 146*c* while leaning against (while applying load on) the edge 146*cc* or an opposite edge (an edge opposite to the edge 146*cc*) 146*cd* of the fitting hole 146*c* depending on the deformations of the casing main body 12 and the cover member 20. Therefore, the protrusion 206 is hard to be pulled out of the fitting hole 146*c* in the −X direction. That is, the casing 2 is configured such that the cover member 20 is fixed to the casing main body 12 more firmly by making use of the deformations of the casing main body 12 and the cover member 20.

The operator can fix the cover member 20 with respect to the casing main body 12 without being forced to perform the difficult operation illustrated using FIG. 5B (specifically, an operation to make the cover member 20 move in the +X direction while pressing the entire cover member 20 toward the casing main body 12).

As shown in FIG. 3, to the end portions 2*a*, 2*b* of the casing 2, configurations for reinforcing the fixed state of the casing main body 12 and the cover member 20 by the fitting of the protrusions 206 and the fitting holes 146*c* are provided. Specifically, at the end portion 2*a*, recessed parts (recessed part formed on the inner wall surface of the casing main body 12 and being fitted parts) 126 are formed to the casing main body 12 and protruded parts 208 (fitting parts) are formed to the cover member 20. At the end portion 2*b*, rectangular holes (fitted parts) 128 are formed to the casing main body 12 and protruded parts 210 (fitting parts) are formed to the cover member 20. The protruded part 208 has a similarity shape corresponding to the recessed part 126 and is smaller than the recessed part 126 to a very small extent. The protruded part 210 has a similarity shape corresponding to the rectangular hole 128 and is smaller than the rectangular hole 128 to a very small extent.

As shown in Step 5 of FIG. 4, as the cover member 20 is moved with respect to the casing main body 12 in the +X direction in order to make the protrusions 206 fit to the fitting holes 146*c*, the protruded part 208 fits to the recessed part 126 and the protruded part 210 fits to the rectangular hole 128 at the timing when the protrusions 206 fit to the fitting holes 146*c*, By the fitting of these members, the fixed state of the casing main body 12 and the cover member 20 by the fitting of the protrusions 206 and the fitting holes 146*c* is reinforced.

The device 1 is configured such that the cover member 20 is fixed with respect to the casing main body 12 without fastening screws. There is no need to form, to the casing 2 of the device 1, screw holes for inserting fastening screws around the space for accommodating built-in components such as electronic parts, Therefore, the casing 2 is easy to design smaller as compared to configurations in which fastening screws and screw holes are necessary. Furthermore, since no screw head is exposed to an appearance of the casing 2, the outer appearance can be made simple.

In order to configure such that the cover member 20 is fixed with respect to the casing main body 12 without fastening screws, adoption of a configuration in which engaging hooks are provided to the entire circumferences of the casing main body 12 and the cover member 20 at predetermined intervals (a so called fixed fitting structure) can be conceived. However, if this configuration is adopted, it becomes difficult to remove the cover member 20 from the casing main body 12 without damage.

As an example, a case where the cover member 20 is to be removed from the casing main body 12 to repair built-in components such as electronic parts is considered. In this case, there is a risk that the casing main body 12 and the cover member 20 (mainly the portions of the fixed fitting structure) are damaged each time the cover member 20 is removed from the casing main body 12, If the casing main body 12 and the cover member 20 are damaged, since the damaged parts need to be discarded and replaced with new parts, cost increases.

In the present embodiment, as load in the −X direction is applied to the cover member 20, the fittings of the protrusions 206 with respect to the fitting holes 146*c* are released, and as the load in the −X direction is continuously applied to the cover member 20, the cover member 20 slides upward (in a direction opposite to the oblique direction D by being guided by the second guide holes 146*b*) with respect to the casing main body 12, As the cover member 20 is lifted upward (in the +Z direction and in a direction away from the casing main body 12), the protrusions 206 pass through the second guide holes 146b and the first guide holes 146a and get out of the holes 146, and the casing main body 12 is brought to a state removed from the cover member 20.

That is, according to the casing 2 of the present embodiment, the cover member 20 can be removed from the casing main body 12 only by the operation of applying the load in the −X direction to the cover member 20 and lifting the cover member 20 upward (in the +Z direction). Therefore, the risk of damaging the casing main body 12 and the cover member 20 is low and thus cost due to damages on these parts can be suppressed.

The foregoing is the description of an illustrative embodiment of the present invention. Embodiments of the present invention are not limited to the one described above, and various modifications are possible within the scope of the technical idea of the present invention. For example, appropriate combinations of embodiments and the like explicitly illustrated in this specification and/or obvious embodiments are also included in the embodiments of this application.

The above-described embodiment has the configuration in which the casing member 10 includes the holes 146 and the cover member 20 includes the protrusions 206. However, in other embodiments, the configuration may be replaced with a configuration in which the casing member 10 includes protrusions and the cover member 20 includes holes.

In the above-described embodiment, the protrusion 206 is a rectangular protrusion whose front edge 206a side is chamfered. However, in other embodiments, the protrusion 206 may be a protrusion having other shape such as a cylindrical shape.

What is claimed is:

1. A device casing, comprising:
a first casing member provided with a hole including a guide hole and a fitting hole that communicates with the guide hole; and
a second casing member provided with a protrusion at a position corresponding to the hole, the second casing member being configured to be fixed with respect to the first casing member by fitting the protrusion to the fitting hole,
wherein the guide hole guides movement of the protrusion that entered within the guide hole in an oblique direction when fixing the second casing member with respect to the first casing member so that the second casing member can get close to the first casing member in a state where the second casing member is guided in the oblique direction,
wherein the protrusion that moved in the oblique direction along the guide hole, passed through the guide hole and reached inside the fitting hole fits to the fitting hole, and
wherein the second casing member is fixed with respect to the first casing member by the fitting of the protrusion to the fitting hole.

2. The device casing according to claim 1, wherein the guide hole:
has a hole shape that extends in the oblique direction; and
guides the protrusion that entered within the guide hole from a starting end of the guide hole in the oblique direction,
wherein the fitting hole has a hole shape that extends in a direction different from the oblique direction, and
wherein the protrusion that passed through a terminal of the guide hole and reached inside the fitting hole fits to the fitting hole.

3. The device casing according to claim 1, wherein:
the oblique direction is a direction at an angle to a first direction,
a plurality of the holes are provided to the first casing member,
the plurality of holes are disposed to be arranged with intervals therebetween in the first direction,
a plurality of the protrusions are provided to the second casing member,
the plurality of protrusions are disposed at positions corresponding to the respective plurality of holes, and
the second casing member is fixed with respect to the first casing member by the protrusions fitting to the fitting holes of the respective holes.

4. The device casing according to claim 1,
wherein the first casing member has:
a casing main body; and
an installed member installed within the casing main body, and
wherein the holes are formed to the installed member.

5. The device casing according to claim 3, wherein:
the first casing member has:
a casing main body; and
an installed member installed within the casing main body,
the holes are formed to the installed member,
the casing main body is a substantially flattened rectangular member with an opening on an upper surface thereof,
the installed member is a frame-like member formed along inner wall surfaces of the casing main body, the plurality of holes being provided at portions along the inner wall surfaces of the casing main body extending in the first direction such that the plurality of holes are arranged with intervals therebetween, and
the second casing member is a substantially flattened rectangular cover member with an opening on a lower surface facing the upper surface of the casing main body, the plurality of protrusions being provided at positions, on inner wall surfaces of the second casing member extending in the first direction, corresponding to the respective plurality of holes, the second casing member covering the opening on the upper surface of the casing main body when the protrusions are fitted to the fitting holes of the respective holes and the second casing member is fixed with respect to the first casing member.

6. The device casing according to claim 1,
wherein the first casing member and the second casing member have a fitted part and a fitting part, respectively, and
wherein when the protrusion fits to the fitting hole, the fitting part fits to the fitted part and reinforces the fixed state of the first casing member and the second casing member by the fitting of the protrusion and the fitting hole.

* * * * *